United States Patent
Goodnow et al.

(10) Patent No.: US 7,065,733 B2
(45) Date of Patent: Jun. 20, 2006

(54) METHOD FOR MODIFYING THE BEHAVIOR OF A STATE MACHINE

(75) Inventors: Kenneth J. Goodnow, Essex, VT (US); Clarence R. Ogilvié, Huntington, VT (US); Christ pher B. Reynolds, Underhill, VT (US); Jack R. Smith, South Burlington, VT (US); Sebastian T. Ventrone, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 160 days.

(21) Appl. No.: 10/725,712

(22) Filed: Dec. 2, 2003

(65) Prior Publication Data

US 2005/0120323 A1 Jun. 2, 2005

(51) Int. Cl.
*G06F 17/50* (2006.01)
*H03K 17/693* (2006.01)

(52) U.S. Cl. .............................. 716/16; 716/17; 716/18
(58) Field of Classification Search ............... 716/1–18
See application file for complete search history.

(56) References Cited

U.S. PATENT DOCUMENTS

| 5,604,888 | A | 2/1997 | Kiani-Shabestari et al. |
| 5,633,806 | A | 5/1997 | Yusa et al. |
| 5,673,198 | A | 9/1997 | Lawman et al. |
| 5,687,325 | A | 11/1997 | Chang |
| 5,796,994 | A * | 8/1998 | Chambers et al. .......... 713/500 |
| 5,903,744 | A | 5/1999 | Tseng et al. |
| 6,011,406 | A | 1/2000 | Veenstra |
| 6,011,740 | A | 1/2000 | Trimberger |
| 6,097,210 | A | 8/2000 | Iwanczuk et al. |
| 6,222,757 | B1 | 4/2001 | Rau et al. |
| 6,311,149 | B1 | 10/2001 | Ryan et al. |
| 6,501,677 | B1 | 12/2002 | Rau et al. |
| 6,556,042 | B1 | 4/2003 | Kaviani |
| 6,581,191 | B1 * | 6/2003 | Schubert et al. ................ 716/4 |
| 2001/0034876 | A1 * | 10/2001 | Panchul et al. ............... 716/18 |
| 2002/0010903 | A1 * | 1/2002 | Osann et al. .................. 716/18 |
| 2003/0149954 | A1 * | 8/2003 | McElvain et al. ............ 716/18 |
| 2004/0025122 | A1 * | 2/2004 | Schubert et al. ................ 716/4 |
| 2005/0062498 | A1 * | 3/2005 | New et al. ..................... 326/41 |

FOREIGN PATENT DOCUMENTS

JP 6125067 A 5/1994

* cited by examiner

*Primary Examiner*—Paul Dinh
*Assistant Examiner*—Nghia M. Doan
(74) *Attorney, Agent, or Firm*—Schmeiser, Olsen & Watts; William H. Steinberg (57) ABSTRACT

A method and system for modifying the function of a state machine having a programmable logic device. The method includes the steps of modifying a high-level design of the state machine to obtain a modified high-level design of the state machine with a modified function; generating a programmable logic device netlist from differences in the high-level design and the high-level modified design; and installing the modified function into the state machine by programming the programmable logic device based on the programmable logic device netlist.

28 Claims, 7 Drawing Sheets

METHOD FOR MODIFYING THE BEHAVIOR OF A STATE MACHINE

FIELD OF THE INVENTION

The present invention relates to the field of modifiable state machines; more specifically, it relates to a method and system for determining and coding modifications to a post fabrication modifiable state machine.

BACKGROUND OF THE INVENTION

Presently, a great majority of integrated circuits employ state machines to control the behavior of the integrated circuit. State machines can be extremely complex in nature and difficult to simulate. Often testing after the integrated circuit has been fabricated discloses that a design error has occurred. Therefore, there is a need to provide both a post-fabrication modifiable state machine, and since these modifications may be very difficult to code, an automated system for coding the modifications to the state machine.

SUMMARY OF THE INVENTION

A first aspect of the present invention is a method for modifying the function of a state machine having a programmable logic device, the method comprising: (a) modifying a high-level design of the state machine to obtain a modified high-level design of the state machine with a modified function; (b) generating a programmable logic device netlist from differences in the high-level design and the modified design; and (c) installing the modified function into the state machine by programming the programmable logic device based on the programmable logic device netlist.

A second aspect of the present invention is a computer system comprising a processor, an address/data bus coupled to the processor, and a computer-readable memory unit adapted to be coupled to the processor, the memory unit containing instructions that when executed by the processor implement a method for modifying the function of a state machine having a programmable logic device, the method comprising the computer implemented steps of: (a) modifying a high-level design of the state machine to obtain a modified high-level design of the state machine with a modified function; (b) generating a programmable logic device netlist from differences in the high-level design and the modified design; and (c) installing the modified function into the state machine by programming the programmable logic device based on the programmable logic device netlist.

BRIEF DESCRIPTION OF DRAWINGS

The features of the invention are set forth in the appended claims. The invention itself, however, will be best understood by reference to the following detailed description of an illustrative embodiment when read in conjunction with the accompanying drawings, wherein:

DETAILED DESCRIPTION OF THE INVENTION

The term designer refers to a human being operating a design system. Unless otherwise noted, all operations are performed automatically by the design system without designer intervention.

The present invention is described using a field programmable gate array (FPGA) as a programmable element. FPGAs are but one type of programmable logic device (PLD) that may be used. Examples of other types of PLDs that may be used in the present invention include but is not limited to programmable read only memories (PROMs), simple programmable logic devices (SPLD) and such programmable array logic (PAL) devices, generic array logic (GAL) devices and programmable logic arrays (PLAs), complex programmable logic devices (CPLDs) such as erasable programmable logic devices (EPLDs), electrically-erasable programmable logic devices (EEPLDs) and multiple array matrices (MAXs), field programmable interconnect devices (FPICs) and other static random access memory (SRAM) based or antifuse based PLDs.

Figure 1:
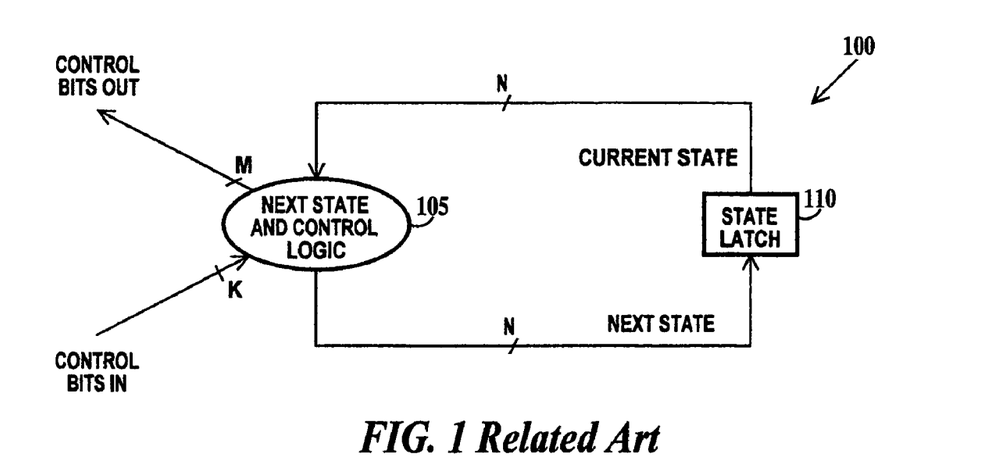
FIG. 1 is a simplified functional block diagram of a related art state machine.

FIG. 1 is a simplified functional block diagram of a related art state machine. In FIG. 1, a state machine 100 includes next state and control logic 105 for determining the next state of the state machine and a state latch 110. Next state logic and control logic 105 generates control bits out for controlling the circuits being controlled by the state machine and receives control bits in from the circuits being controlled by the state machine. Next state and control logic 105 generates next state signals, which are latched by state latch 110 and receives the current state signals from the state latch. There are several options for modifying state machine 100 and thus the behavior of the integrated circuit controlled by the state machine. These options will be discussed infra.

Figure 2A:
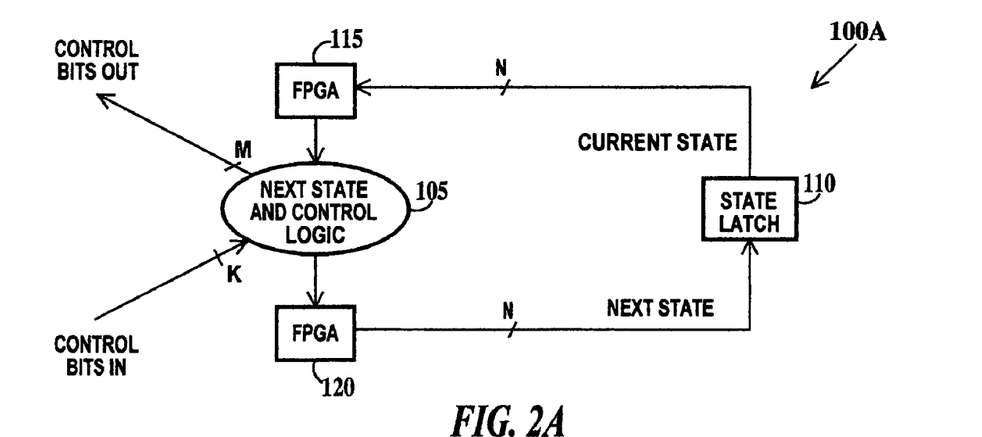
FIGS. 2A through 2E are simplified functional block diagrams of modifiable state machines according to the present invention.

FIGS. 2A through 2E are simplified functional block diagrams of modifiable state machines according to the present invention. In FIG. 2A, state machine 100A is similar to state machine 100 of FIG. 1, except an FPGA 115 is inserted in the current state path between state latch 110 and next state and control logic 105 and a FPGA 120 is inserted in the next state path between the state latch and the next state and control logic. FPGAs 115 and 120 allow modification of the next state signal before the next state is latched by state latch 110 and allows modifications to the current state signal from the state latch before the current state is received by next state and control logic 105. Modifying either the next state or current state signal will alter the behavior of state machine 100A. As fabricated, FPGAs 115 and 120 are in a default pass through mode. Multiplexers are not shown but required in FIG. 2A. With the appropriate FPGA wiring configuration multiplexing can be accomplished within the FPGA fabric and does not require additional multiplexers outside of the FPGA fabric.

Figure 3:
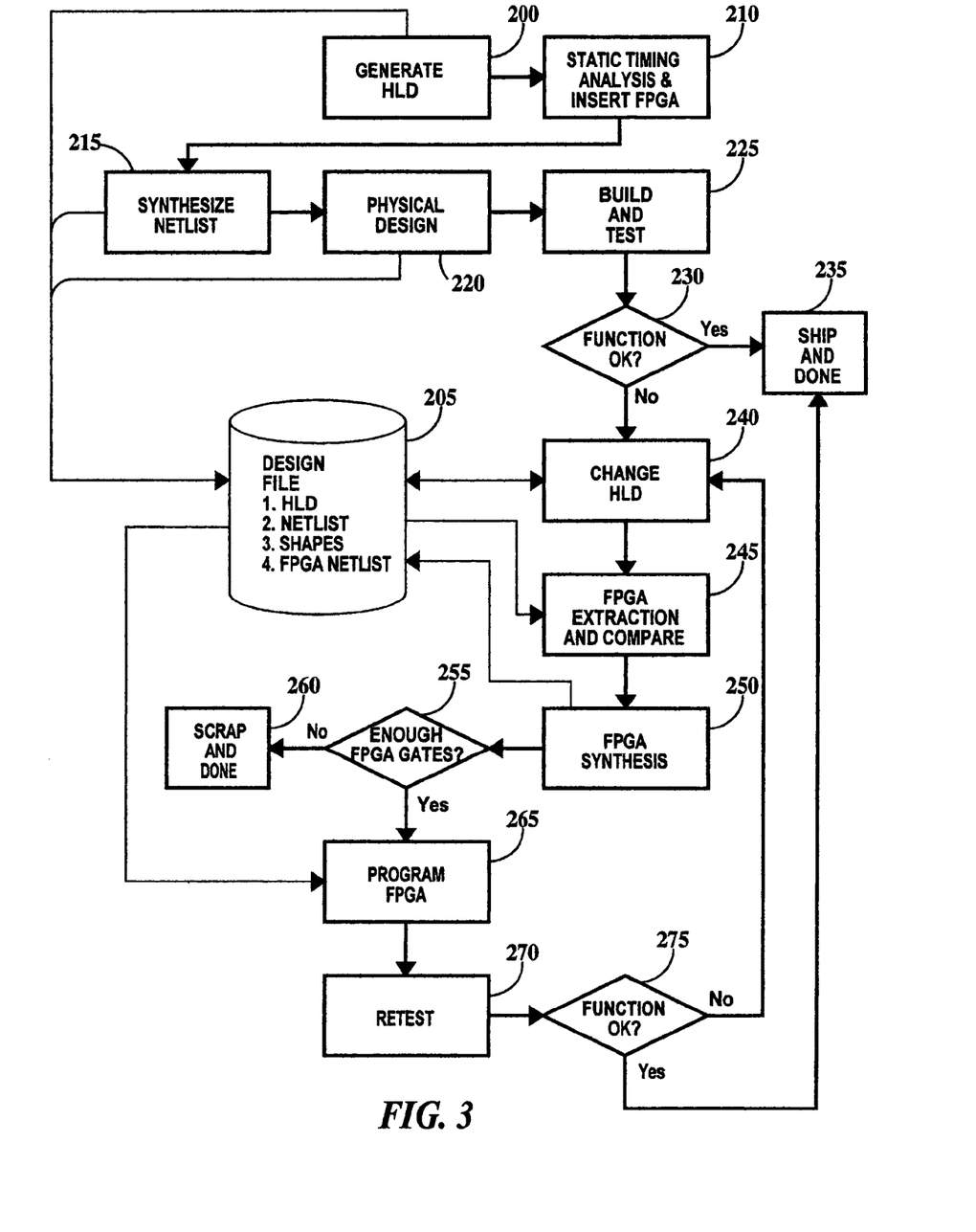
FIG. 3 is a flowchart of the method of designing and determining the programming required for a field programmable gate array in order to modify the behavior of a modifiable state machine according to the present invention.

In most schematic diagrams multiplexers interconnecting inputs, outputs, state machine logic circuits, state machine state latches, FPGAs and internal state paths are not shown but are required. Multiplexers allow bypassing FPGAs or directing signals to the FPGAs so the signals can be changed or their path altered by the programmed FPGAs. Multiplexers are not shown because their placement and interconnection is driven by the specific design requirements of a given application. One of ordinary skill in the art would know where multiplexers should be placed and how they should be interconnected. Multiplexers are placed during the initial integrated design process as illustrated in FIG. 3 and described infra.

Figure 2B:
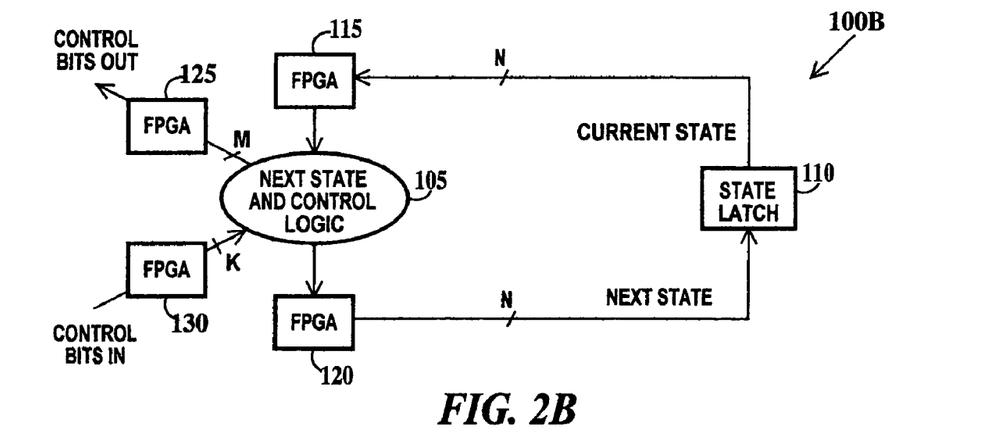

In FIG. 2B, state machine 100B is similar to state machine 100A of FIG. 2A, except a FPGA 125 is inserted in the control bits out path between next state and control logic 105 and the circuits being controlled and a FPGA 130 is inserted in the control bits in path between circuits being controlled and the next state and control logic. FPGAs 125 and 130 allow modification of the control bits out and control bits in respectively. Modifying the control bits out will modify the function of the circuits being controlled by state machine 100B and modifying control bits in will modify the behavior of the state machine. As fabricated, FPGAs 115, 120, 125 and 130 are in a default pass through mode.

Figure 2C:
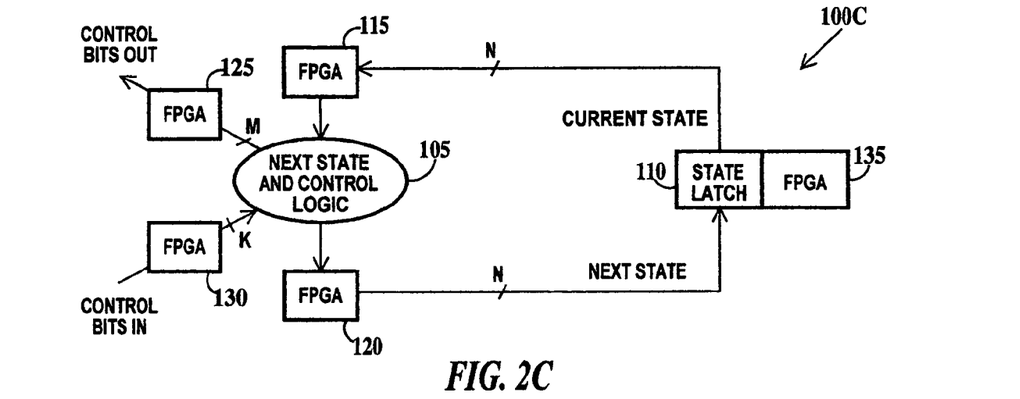

In FIG. 2C, state machine 100C is similar to state machine 100B of FIG. 2B, except a FPGA 135 programmable as a latch is added to state latch 110. FPGA 135 adds additional states to state machine 100C. As fabricated, FPGAs 115, 120, 125, 130 and 135 are in a default pass through mode.

Figure 2D:
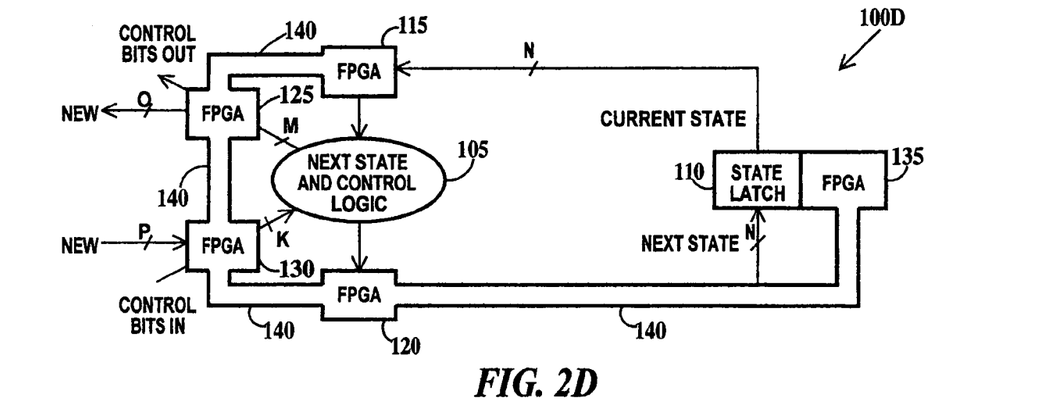

In FIG. 2D, state machine 100D is similar to state machine 100C of FIG. 2CB, except FPGAs 115, 120, 125, 130 and 135 are interconnected by a programmable wire fabric 140. Fabric 140 allows all states and all I/O functions including new bits out and new bits in to be available to all of the FPGAs. As fabricated, FPGAs 115, 120, 125, 130 and 135 are in a default pass through mode and all programmable wires are connected to default circuit nodes.

Figure 2E:
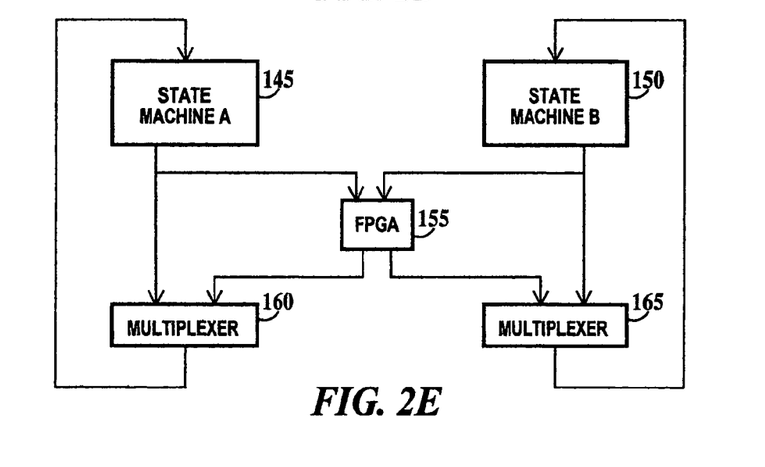

In FIG. 2E, a first state machine 145 and a second state machine 150 share the same FPGA 155. The output of state machines 145 is coupled to the input of FPGA 155 and the input of a first multiplexer 160. The output of state machines 150 is coupled to the input of FPGA 155 and the input of a second multiplexer 165. The output of first multiplexer 160 is coupled to the input of first state machine 145 and the output of second multiplexer 165 is coupled to the input of second state machine 150.

FIG. 3 is a flowchart of the method of designing and determining the programming required for a FPGA in order to modify the behavior of a modifiable state machine according to the present invention. In step 200, an integrated circuit design in a high-level design (HLD) language is generated and the HLD design is stored in a design file 205. In step 210, FPGAs including multiplexers that would be needed to modify state machine inputs, outputs and internal paths are inserted into the HLD design and a static timing analysis performed (see FIG. 4 and description infra). In step 215, design synthesis is performed on the HLD design to generate a netlist, which is stored in design file 205. In step 220, physical design is completed and a shapes files, used to fabricate a photolithographic mask set used in fabricating the integrated circuit is generated. In step 225, the integrated circuit is fabricated and tested.

In step 230 it is determined if the integrated circuit functions as expected. If in step 230, the integrated circuit functions as expected then in step 235, the integrated circuit is shipped, otherwise the method proceeds to step 240. It should be noted that integrated circuit function covers the cases of (1) a fail due to a design error in the state machine, (2) fails caused by circuit fails or design errors that are correctable by a change to the state machine and (3) changes to a otherwise good integrated circuit to modify its function or performance that are implementable by a change to the state machine. Fails due to defects and all other reasons are or that are not correctable by a change to the state machine are screened out in step 225.

In step 240, the original HLD design is changed in order to modify the function of the state machine and the new HLD design is stored in design file 205. Changing of the original HLD can be done without intervention of the designer other than to point to the original and new HLD files. Alternatively, the designer can provide input to this process to this process in identifying the HDL code to be implemented in the FPGA. In step 245, a FPGA extraction tool parses and reads all the lines of the HLD code for the original and new designs and compares them. It extracts out of the new design all lines of code that are different or not found in the original HLD design code. This is done without intervention from the designer other than to point to the two HLD files. Examples of function changes that the compare may find includes but is not limited to (1) new state machine inputs, (2) new state machine outputs, (3) output changes based on input and state, (4) new state machine states and (5) new or changed state decision paths. Examples of the FPGA portion of original and new HLD codes and the extracted HLD code are given infra.

In step 250, FPGA synthesis is performed to create a FPGA netlist, which is stored in design file 205. The synthesizer knows the available design elements (including the FPGA array or arrays and multiplexers) from the netlist structure synthesized in step 215. The synthesizer then synthesizes an FPGA logic structure to support the new or changed logic functions and synthesizes any interconnects to multiplexers that may be needed to bypass the original state machine paths and replace them with paths through the FPGA logic structure. Next, in step 255, it is determined if the FPGA is large enough to program the changes required by the FPGA netlist. If the FPGA is not large enough, then re-synthesis of the updated FPGA function can be performed until a solution is found which fits in the available FPGA. If this is ultimately unsuccessful, then in step 260, the integrated circuit is scrapped (or used for other PINs) and the method terminates, otherwise the method proceeds to step 265. Steps 250 and 255 are done without intervention from the designer other than to point to the original netlist and the FPGA netlist.

In step 265, the FPGA of the integrated circuit (in hardware) is programmed using the FPGA netlist code as a basis. First, the FPGA netlist is compiled into a SRAM configuration pattern. Second, the compiled pattern is then applied to the SRAM array on the physical integrated circuit in order to program the SRAM. Third, the SRAM "wires" the FPGA array or arrays to activate the changed functions, to activate any new functions and deactivate any obsoleted functions. The preceding description of an SRAM-based FPGA embodiment is described as an example. The present invention is applicable to a variety of other types of PLDs as described supra. Then, in step 270, the integrated circuit is retested and in step 275, it is determined if the integrated circuit functions as expected. If in step 275, the integrated circuit functions as expected then in step 235, the integrated circuit is shipped, otherwise the method proceeds to step 240. Thus, other than to change the HLD design for the new state machine functions, no significant intervention by the designer is required to produce a physical integrated chip with the new or changed functions.

Figure 4:
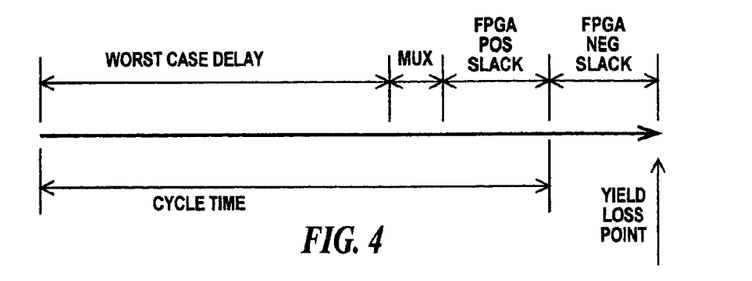
FIG. 4 is a diagram illustrating a static timing analysis as practiced by the present invention.

FIG. 4 is a diagram illustrating a static timing analysis as practiced by the present invention. In FIG. 4, the cycle time of a an integrated circuit includes the worst case (longest path) circuit delay and hardwired state machine delay plus any delay through the multiplexers added to the state machine plus FPGA positive slack. Slack is a measure of how much earlier a signal arrives than the specified time it must arrive at. Positive slack provides an operating margin. Based on the amount of positive slack, the designer can determine how large the FPGA can be (the larger, the more delay). The designer can use some or all of the negative slack in order to increase the size of the FPGA.

Figure 5:
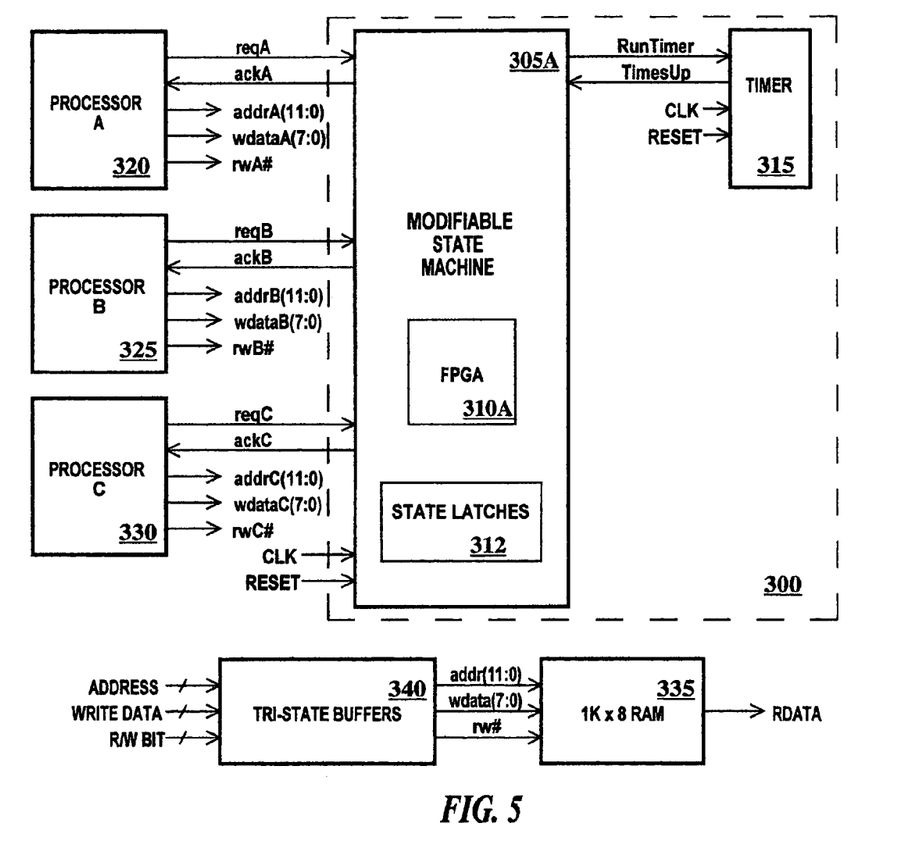
FIG. 5 is a block schematic diagram of an exemplary application utilizing a modifiable state machine.

FIG. 5 is a block schematic diagram of an exemplary application utilizing a modifiable state machine. In FIG. 5, a 3-way round robin arbiter 300 is illustrated. Arbiter 300 includes a state machine 305A including a FPGA 310A (or other PLD) and state latches 312, and a timer 315. Required multiplexers are not shown, but one of ordinary skill in the art would know how to configure multiplexers into the original design HLD as described supra. A first processor 320, a second processor 325, a third processor 330 share access to random access memory (RAM) 335 via a tri-state buffer 340. Arbiter 300 grants access to one processor 320, 325 or 330 at a time. When more than one processor request access to RAM 335 at the same time the state machine is hardwired to grant access in the priority in a fixed order, for example, processor 320 first, processor 325 second and processor 330 third. The input signals reqA, reqB, reqC and TimesUp from processor 320, processor 325, processor 330 and timer 310A respectively to state machine 305A are key signals as are the output signals ackA, ackB, ackC and RunTimer to from processor 320, processor 325, processor 330 and timer 310A respectively from state machine 305A.

ReqA, reqB and reqC are requests from the respective processors 320, 325 and 330 for access to the ADDRESS, WRITE DATA and R/W BIT buses. AckA, ackB and ackC are grants of access to buses ADDRESS, WRITE DATA and R/W BIT by state machine 305A to respective processors 320, 325 and 330. AddrA, addrB and AddC are RAM 335 addresses from respective processors 320, 325 and 330. WdataA, wdataB and WdataC are write data to RAM 335 from respective processors 320, 325 and 330. RwA, rwB and rwC are read/write bits from respective processors 20, 325 and 330 to RAM 335.

Figure 6A:
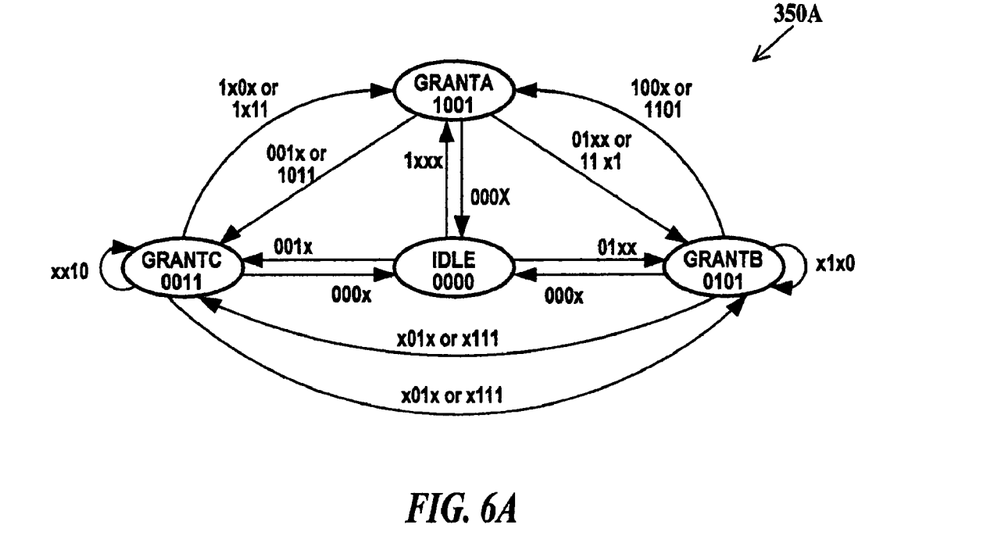
FIG. 6A is a state diagram of the state machine of FIG. 5 fabricated as designed by the present invention.
Figure 6B:
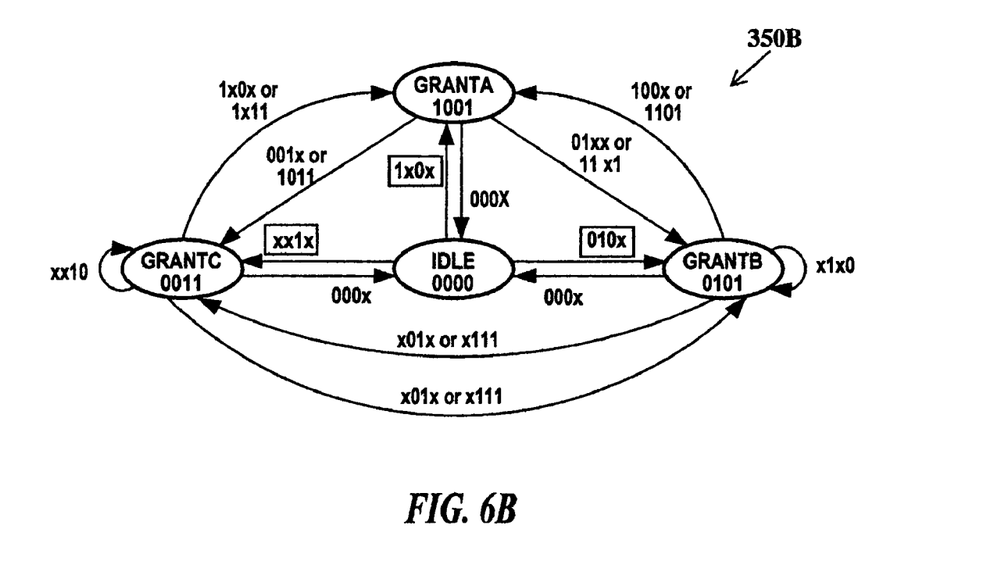
FIG. 6B is a state diagram of the state machine of FIG. 5 as modified by the present invention.

State machine 305A (with FPGA in default mode, i.e. original arbiter function and FPGA not used) is illustrated in FIG. 6A and described infra. A modified version of state machine 305A using FPGA to modify the function of arbiter 300 is illustrated in FIG. 6B and described infra.

FIG. 6A is a state diagram of the state machine of FIG. 5 fabricated as designed by the present invention. In FIG. 6A, state machine 350A is designed to grant access to processors A, B and C (processors 320, 325 and 330 to RAM 335 of FIG. 5) in the priority order A, B, C. When the state machine is idle, the state machine state is 0000. When processor A is granted access, the state machine state is 1001. When processor B is granted access, the state machine state is 0101. When processor C is granted access the state machine state is 0011. Transition between these states can only occur when an input to the state machine matches the values on the state transition path between the current state and the next state. For example transition from state 1001 (GrantA) to state 0101 (GrantB) can only when an input is either 01xx or 11x1, where x is a "don't care bit" and can be 0 or 1. The portion of the HLD code describing state machine 350A is given in TABLE I.

TABLE I

```
ENTITY arbiter IS
PORT(clk:                in std_logic; --Clk for state machine
    reset:               in std_logic; --Reset
    reqA, reqB, reC:     in std_logic; --Request from processors A, B, and C
    timesup:             in std_logic; --Interrupt from timer
    ackA, ackB, ackC:    out std_logic; --Acknowledge to processors A, B and C
    runtimer:            out std_logic); --Command to continue running timer
end ENITY arbiter;
ARCHITECTURE arbiter_arch of arbiter IS
type state is (idle,grantA,grantB,grantC);          --States
signal pstate: state := idle;                       --State variable (2 F/Fs in machine)
begin
nextst: process(reset, clk)                         --Assign next state
begin
    if reset='1' then                               --Reset
    pstate <= idle;
    elsif (clk'event and clk='1') then
        case pstate is
        when idle => if reqA='1' then    --Processor A requests bus
                    pstate<=grantA;
                elsif reqB='1' then      --Processor B requests bus
                    pstate<=grantB;
                elsif reqC='1' then      --Processor C requests bus
                    pstate<=grantC;
                else                     --No Request
                    pstate<=idle;
                end if:
        when grantA=> if (reqA='1'andtimesup='0') then   --A still operating
                    pstate<=grantA;
                else                                      --A dropped request
                if reqB='1' then                          --B requests bus
                    pstate<=grantB;
                elsif reqC='1' then                       --C requests bus
                    pstate<=grantC;
                else
                    pstate<=idle;                         --Nobody wants bus
```

TABLE I-continued

```
            end if;
          end if;
        when grantB=> if (reqB='1'andtimesup='0') then        --B still operating
                        pstate<=grantB;
                      else                                    --B dropped request
                        if reqC='1' then                      --C requests bus
                          pstate<=grantC;
                        elsif reqA='1' then                   --A requests bus
                          pstate<=grantA;
                        else
                          pstate<=idle;                       --Nobody wants bus
                        end if;
                      end if;
        when grantC=> if (reqA='1'andtimesup='0') then        --C still operating
                        pstate<=grantC;
                      else                                    --C dropped request
                        if reqA='1' then                      --A requests bus
                          pstate<=grantA;
                        elsif reqB='1' then                   --B requests bus
                          pstate<=grantB;
                        else
                          pstate<=idle;                       --Nobody wants bus
                        end if;
                      end if;
        when others => pstate<=idle;                          --Can't happen
      end case
    end if;
  end process nextst;
    outsig: process(pstate)                                   --Assign outputs
    begin
      case pstate is
        when idle =>       ackA<='0';                         --Idle
                           ackB<='0';
                           ackC<='0';
                           runtimer<='0';
        when grantA =>     ackA<='1';                         --A owns bus
                           ackB<='0';
                           ackC<='0';
                           runtimer<='1';
        when grantB =>     ackA<='0';
                           ackB<='1';                         --B owns bus
                           ackC<='0';
                           runtimer<='1';
        when grantC =>     ackA<='0';
                           ackB<='0';
                           ackC<='1';                         --C owns bus
                           runtimer<='1';
      end case;
    end process outsig;
end ARCHITECTURE arbiter_arch
```

FIG. 6B is a state diagram of the state machine of FIG. 5 as modified by the present invention. In FIG. 6B, state machine 350B is a modified version of state machine 350A of FIG. 6A and is designed to grant access to processors A, B and C (processors 320, 325 and 330 to RAM 335 of FIG. 5) in the priority order C, A, B. When the state machine is idle, the state machine state is 0000. When processor A is granted access, the state machine state is 1001. Notice none of the states of the state machine has changed in this example. When processor B is granted access, the state machine state is 0101. When processor C is granted access the state machine state is 0011. What has changed is the input required to transition from state 0000 (idle) to 0101 (grantB) which was 01xx and is now 010x, to transition from state 0000 (idle) to 0011 (grantC) which was 001x and is now xx1x and to transition from state 0000 (idle) to 1001 (grantA) which was 1xxx and is now 1x0x. These three changes are enclosed in boxes. The portion of the HLD code describing state machine 350B is given in TABLE II.

TABLE II

```
ENTITY arbiter IS
  PORT(clk:                  in std_logic;   --Clk for state machine
       reset:                in std_logic;   --Reset
       reqA, reqB, reC:      in std_logic;   --Request from processors A, B, and C
       timesup:              in std_logic;   --Interrupt from timer
       ackA, ackB, ackC:     out std_logic;  --Acknowledge to processors A, B and C
       runtimer:             out std_logic); --Command to continue running timer
  end ENITY arbiter;
  ARCHITECTURE arbiter_arch of arbiter IS
```

TABLE II-continued

```
type state is (idle,grantA,grantB,grantC);    --States
signal pstate: state := idle;                 --State variable (2 F/Fs in machine)
begin
nextst: process(reset, clk)                   --Assign next state
begin
    if reset='1' then                         --Reset
    pstate <= idle;
    elsif (clk'event and clk='1') then
        case pstate is
            when idle => if reqC='1' then     --Processor C requests bus
                    pstate<=grantA;
                elsif reqA='1' then           --Processor A requests bus
                    pstate<=grantA;
                elsif reqB='1' then           --Processor B requests bus
                    pstate<=grantB;
                else                          --No Request
                    pstate<=idle;
                end if;
            when grantA=> if (reqA='1'andtimesup='0') then    --A still operating
                    pstate<=grantA;
                else                          --A dropped request
                    if reqB='1' then          --B requests bus
                        pstate<=grantB;
                    elsif reqC='1' then       --C requests bus
                        pstate<=grantC;
                    else
                        pstate<=idle;         --Nobody wants bus
                    end if;
                end if;
            when grantB=> if (reqB='1'andtimesup='0') then    --B still operating
                    pstate<=grantB;
                else                          --B dropped request
                    if reqC='1' then          --C requests bus
                        pstate<=grantC;
                    elsif reqA='1' then       --A requests bus
                        pstate<=grantA;
                    else
                        pstate<=idle;         --Nobody wants bus
                    end if;
                end if;
            when grantC=> if (reqA='1'andtimesup='0') then    --C still operating
                    pstate<=grantC;
                else                          --C dropped request
                    if reqA='1' then          --A requests bus
                        pstate<=grantA;
                    elsif reqB='1' then       --B requests bus
                        pstate<=grantB;
                    else
                        pstate<=idle;         --Nobody wants bus
                    end if;
                end if;
            when others => pstate<=idle;      --Can't happen
        end case
    end if;
end process nextst;
        outsig: process(pstate)               --Assign outputs
        begin
            case pstate is
                when idle =>     ackA<='0';   --Idle
                                 ackB<='0';
                                 ackC<='0';
                                 runtimer<='0';
                when grantA =>   ackA<='1';   --A owns bus
                                 ackB<='0';
                                 ackC<='0';
                                 runtimer<='1';
                when grantB =>   ackA<='0';
                                 ackB<='1';   --B owns bus
                                 ackC<='0';
                                 runtimer<='1';
                when grantC =>   ackA<='0';
                                 ackB<='0';
                                 ackC<='1';   --C owns bus
                                 runtimer<='1';
            end case;
        end process outsig;
end ARCHITECTURE arbiter_arch
```

The portion of the HLD code in bold and repeated in TABLE III, shows all the differences between the original HLD code and the new HLD code that would be found in step 245 of FIG. 3 and that would be synthesized in step 250 of FIG. 3 to generate a FPGA netlist.

TABLE III

```
when idle => if reqC='1' then      --Processor C requests bus
                pstate<=grantA;
             elsif reqA='1' then    --Processor A requests bus
                pstate<=grantA;
             elsif reqB='1' then    --Processor B requests bus
                pstate<=grantB;
             else                   --No Request
                pstate<=idle;
             end if:
```

Figure 7:
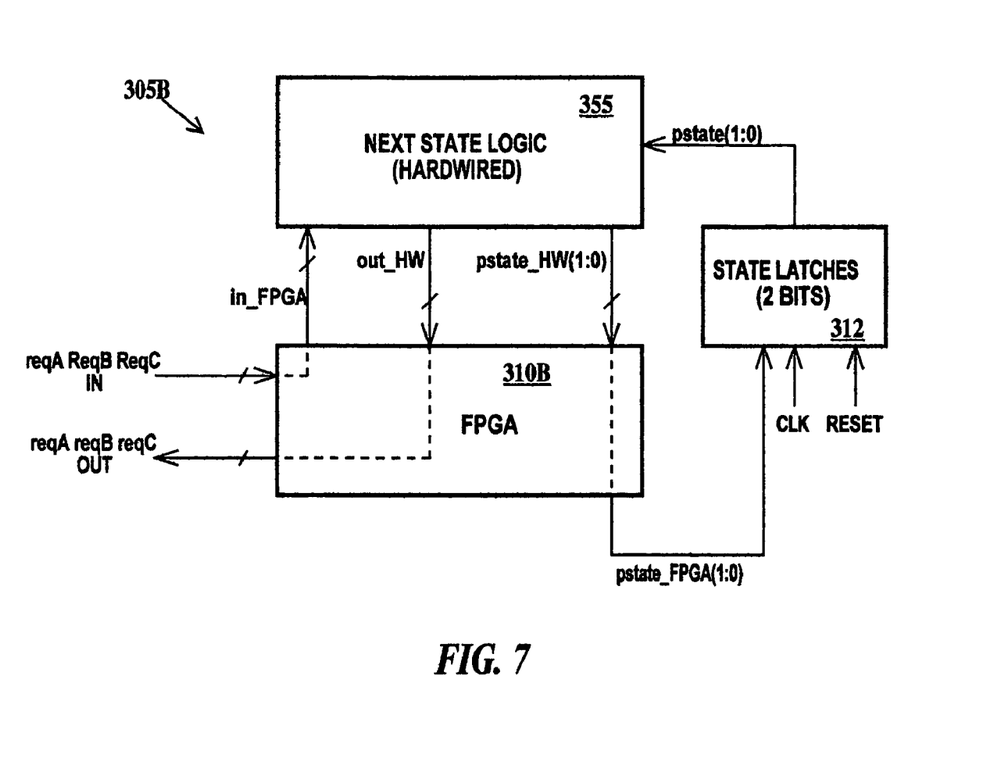
FIG. 7 is a block schematic diagram of a portion of the modifiable state machine of FIG. 5 after implementation of the coding to modify the behavior of the state machine according to the present invention.

FIG. 7 is a block schematic diagram of a portion of the modifiable state machine of FIG. 5 after implementation of the coding to modify the behavior of the state machine according to the present invention. In FIG. 7, a portion of state machine 305A of FIG. 5, modified state machine 305B, includes the original hardwired next state logic 355, the programmed FPGA 310A of FIG. 5, FPGA 310B, and a change of input to state latches 312. Multiplexers have not be illustrated in FIG. 7. The FPGA netlist generated from the code of TABLE III (step 250 of FIG. 3) supra is listed in TABLE IV.

The FPGA netlist of table IV results in the hardware of FIG. 7 after synthesis. The changes include: (1) directing reqA, reqB and reqC through FPGA 310B to new path in_FPGA to next state logic 355, (2) redirecting out_HW through FPGA 310B to reqA, reqB and reqC, (3) directing pstate_HW(1;0) through FPGA 310B to new path pstate_F-PGA(1:0) then to state latches 312. The paths through (dashed lines) FPGA 310B result from the programming of the SRAM (based on the compiled FPGA netlist) that "wires" the gates of FPGA 310B.

Figure 8:
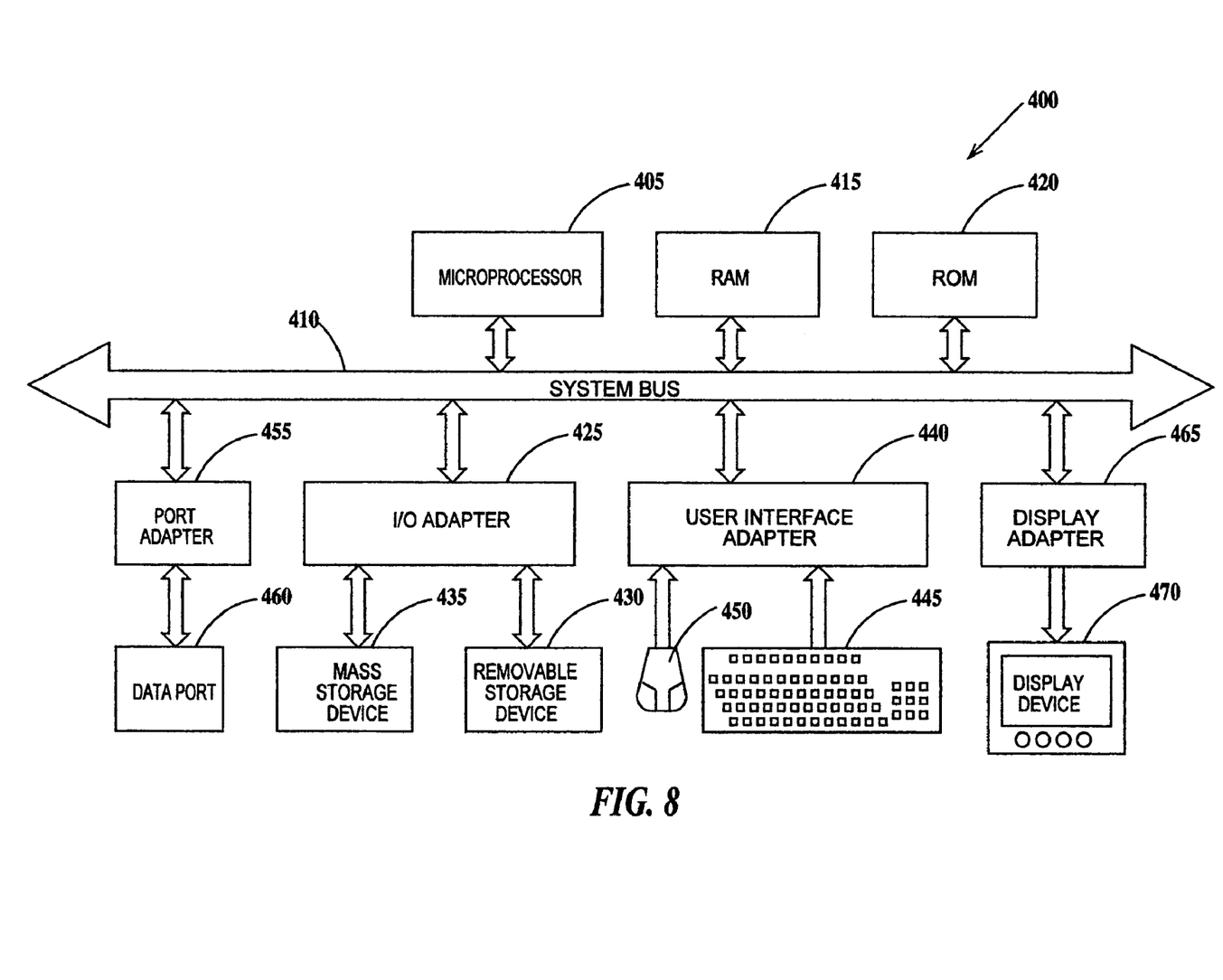
FIG. 8 is a schematic block diagram of a general-purpose computer for practicing the present invention.

FIG. 8 is a schematic block diagram of a general-purpose computer for practicing the present invention Generally, the method described herein with respect to modifying a FPGA modifiable state machine is practiced with a general-purpose computer and the method may be coded as a set of instructions on removable or hard media for use by the general-purpose computer. FIG. 8 is a schematic block diagram of a general-purpose computer for practicing the present invention. In FIG. 8, computer system 400 has at least one microprocessor or central processing unit (CPU) 405. CPU 405 is interconnected via a system bus 410 to a random access memory (RAM) 415, a read-only memory (ROM) 420, an input/output (I/O) adapter 425 for a connecting a removable data and/or program storage device 430 and a mass data and/or program storage device 435, a user interface adapter 440 for connecting a keyboard 445 and a

TABLE IV

```
PACKAGE sm-defs IS
type state is (idle, grantA,grantB,grantC);
end sm_defs;
ENTITY arbiter_fpgaPortion IS
                        --FPGA INPUTS
PORT(reqA, reqB, reC:   in std_logic;    --Requests from processors A, B and C
     timesup:           in std_logic;    --Interrupt from timer
                        --SIGNALS FROM HARDWIRED LOGIC
     pstate_hardwired:  in state;        --Next state
     ackA_hardwired:    in std_logic;    --Acknowledge
     ackB_hardwired:    in std_logic;    --Acknowledge
     ackC_hardwired:    in std_logic;    --Acknowledge
     runtimer_hardwired: in std_logic:   --Continue running timer
                        --NEXT STATE (FPGA out to latches)
     pstate_fpga:       out state;
                        --STATE MACHINE OUTPUTS
     ackA, ackB, ackC:  out std_logic    --Acknowledge to processors A, B and C
     runtimer:          out std_logic    --Command to continue running timer
end arbiter_fpgaPortion'
ARCHITECTURE arbiter_fgaPortion_arch of arbiter_fpgaPortion IS
signal pstate: state                     --State variable (2 F/Fs on state machine)
begin
nextst: process(reqA, reqB, reqC, pstate_hardwired)     --Assign next state
begin
    case pstate_hardwired is
    when idle => if reqC='1' then                       --Processor C requests bus
       pstate_fpga <= grantC
       elsif reqA='1' then                              --Processor A requests bus
       pstate_fpga <= grantA
       elsif reqB='1' then                              --Processor B requests bus
       pstate_fpga <= grantB
       else                                             --No request
       pstate_fpga <= idle;
       end if;
    when others => pstate_fpga <= pstate_hardwired;     --Use output of hardwire
    end case;
    end process nextst;
                --ASSIGN OUTPUTS Pass hardwired values through FPGA
    ackA<=ackA_hardwired;
    ackB<=ackB_hardwired;
    ackC<=ackC_hardwired;
    runtimer<=runtimer_hardwired;
end arbiter_fpgaPortion_arch
``` mouse 450, a port adapter 455 for connecting a data port 460 and a display adapter 465 for connecting a display device 470.

ROM 420 contains the basic operating system for computer system 400. The operating system may alternatively reside in RAM 415 or elsewhere as is known in the art. Examples of removable data and/or program storage device 430 include magnetic media such as floppy drives and tape drives and optical media such as CD ROM drives. Examples of mass data and/or program storage device 435 include hard disk drives and non-volatile memory such as flash memory. In addition to keyboard 445 and mouse 450, other user input devices such as trackballs, writing tablets, pressure pads, microphones, light pens and position-sensing screen displays may be connected to user interface 440. Examples of display devices include cathode-ray tubes (CRT) and liquid crystal displays (LCD).

A computer program with an appropriate application interface may be created by one of skill in the art and stored on the system or a data and/or program storage device to simplify the practicing of this invention. In operation, information for or the computer program created to run the present invention is loaded on the appropriate removable data and/or program storage device 430, fed through data port 460 or typed in using keyboard 445.

Thus, both a post-fabrication modifiable state machine and an automated system for coding the modifications to the state machine is provided by the present invention.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore it is intended that the following claims cover all such modifications and changes as fall within the true spirit and scope of the invention.

What is claimed is:

1. A method for modifying the function of a state machine having a programmable logic device, the method comprising:
   (a) modifying a high-level design of said state machine to obtain a modified high-level design of said state machine with a modified function;
   (b) generating a programmable logic device netlist from differences in said high-level design and said modified high-level design, said generating including extracting a high-level programmable logic device design from said modified high-level design, said extracting including comparing said high-level design to said modified high-level design; and
   (c) installing said modified function into said state machine by programming said programmable logic device based on said programmable logic device netlist.

2. The method of claim 1, wherein said generating a programmable logic device netlist includes synthesizing said a high-level programmable logic device design.

3. The method of claim 2, wherein said programming of said programmable logic device includes compiling said programmable logic device netlist into a pattern and applying said pattern to a static random access memory array of an integrated circuit containing said state machine and said programmable logic device.

4. The method of claim 1, further including the step of;
   (d) determining if said programmable logic device includes enough gates to program said modified function.

5. The method of claim 1, further including, before step (a) performing a static timing analysis to determine a maximum allowable size for said programmable logic device.

6. The method of claim 4, wherein said performing said static timing analysis is performed on a netlist synthesized from said high-level design of said state machine.

7. The method of claim 1, wherein said high-level design of said state machine is a portion of a high level design of an integrated circuit and said modified high-level design of said state machine is a portion of a modified version of said high level design of said integrated circuit.

8. The method of claim 1, wherein said programmable logic device is connectable between a next stage logic and a state latch of said state machine in either a next state path, a current state path or both.

9. The method of claim 1, wherein said programmable logic device is connectable between an input of said state machine and an output of said state machine.

10. The method of claim 1, wherein said programmable logic device is shared between said state machine and one or more additional state machines.

11. The method of claim 1, wherein said programmable logic device is selected from the group consisting of programmable read only memories, simple programmable logic devices, programmable array logic devices, generic array logic devices, programmable logic arrays, complex programmable logic devices, erasable programmable logic devices, electrically-erasable programmable logic devices, multiple array matrices, field programmable interconnect devices, static random access memory based programmable logic devices and antifuse based programmable logic devices.

12. The method of claim 1, wherein said high-level design of said state machine and said high level-design of said state machine with said modified function are in the same file format.

13. A computer system comprising a processor, an address/data bus coupled to said processor, and a computer-readable memory unit adapted to be coupled to said processor, said memory unit containing instructions that when executed by said processor implement a method for modifying the function of a state machine having a programmable logic device, said method comprising the computer implemented steps of:
   (a) modifying a high-level design of said state machine to obtain a modified high-level design of said state machine with a modified function;
   (b) generating a programmable logic device netlist from differences in said high-level design and said modified high-level design; said generating including extracting a high-level programmable logic device design from said modified high-level design, said extracting including comparing said high-level design to said modified high-level design and
   (c) installing said modified function into said state machine by programming said programmable logic device based on said programmable logic device netlist.

14. The computer system of claim 13, wherein said generating a programmable logic device netlist includes synthesizing said a high-level programmable logic device design.

15. The computer system of claim 16, wherein said programming of said programmable logic device includes compiling said programmable logic device netlist into a pattern and applying said pattern to a static random access memory array of an integrated circuit containing said state machine and said programmable logic device.

16. The computer system of claim 13, further including tho step of:
(d) determining if said programmable logic device includes enough gates to program said modified function.

17. The computer system of claim 16, wherein said performing said static timing analysis is performed on a netlist synthesized from said high-level design of said state machine.

18. The computer system of claim 13, further including, before step (a) performing a static timing analysis to determine a maximum allowable size for said programmable logic device.

19. The computer system of claim 13, wherein said high-level design of said state machine is a portion of a high level design of an integrated circuit and said modified high-level design of said state machine is a portion of a modified version of said high level design of said integrated circuit.

20. The computer system of claim 13, wherein said programmable logic device is connectable between a next stage logic and a state latch of said state machine in either a next state path, a current state path or both.

21. The computer system of claim 13, wherein said programmable logic device is connectable between an input of said state machine output of said state machine.

22. The computer system of claim 13, wherein said programmable logic device is shared between said state machine and one or more additional state machines.

23. The computer system of claim 13, wherein said programmable logic device is selected from the group consisting of programmable read only memories, simple programmable logic devices, programmable array logic devices, generic array logic devices, programmable logic arrays, complex programmable logic devices, erasable programmable logic devices, electrically-erasable programmable logic devices, multiple array matrices, field programmable interconnect devices, static random access memory based programmable logic devices and antifuse based programmable logic devices.

24. The computer system of claim 13, wherein, in said method step (a), said high-level design of said state machine and said high level-design of said state machine with said modified function are in a same file format.

25. A method for modifying the function of a state machine having a programmable logic device, the method comprising:
(a) creating a high-level design of an integrated circuit, said high-level design of said integrated circuit including a high-level design of said state machine;
(b) modifying said high-level design of said state machine to obtain a modified high-level design of a modified state machine with a modified function;
(c) extracting the differences between a state machine section of said high-level design and said a state machine section of said modified high level design, said differences including all lines of code in said modified high-level design that are different or not found in said high-level design;
(d) generating a modified programmable logic array netlist from a programmable logic array netlist and said differences between said high-level design and said modified high-level design, said programmable logic array netlist generated from said high-level design; and
(e) installing said modified function into said state machine of said integrated circuit implemented in hardware by programming said programmable logic array with a software program based on said modified programmable logic array netlist.

26. The method of claim 25, wherein said differences are new state machine inputs, new state machine outputs, output changes based on input and state, new state machine states and new or changed state decision paths or combinations thereof.

27. A computer system comprising a processor, an address/data bus coupled to said processor, and a computer-readable memory unit adapted to be coupled to said processor, said memory unit containing instructions that when executed by said processor implement a method for modifying the function of a state machine having a programmable logic device, said method comprising the computer implemented method steps of:
(a) creating a high-level design of an integrated circuit, said high-level design of said integrated circuit including a high-level design of said state machine;
(b) modifying said high-level design of said state machine to obtain a modified high-level design of a modified state machine with a modified function;
(c) extracting the differences between a state machine section of said high-level design and said a state machine section of said modified high level design, said differences including all lines of code in said modified high-level design that are different or not found in said high-level design;
(d) generating a modified programmable logic array netlist from a programmable logic array netlist and said differences between said high-level design and said modified high-level design, said programmable logic array netlist generated from said high-level design; and
(e) installing said modified function into said state machine of said integrated circuit implemented in hardware by programming said programmable logic array with a software program based on said modified programmable logic array netlist.

28. The system of claim 25, wherein said differences extracted in method step (b) are new state machine inputs, new state machine outputs, output changes based on input and state, new state machine states and new or changed state decision paths or combinations thereof.

* * * * *